(12) United States Patent
Silfvast

(10) Patent No.: US 6,576,917 B1
(45) Date of Patent: Jun. 10, 2003

(54) ADJUSTABLE BORE CAPILLARY DISCHARGE

(75) Inventor: William T. Silfvast, St. Helena, CA (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 09/490,662

(22) Filed: Jan. 24, 2000

Related U.S. Application Data (63) Continuation-in-part of application No. 09/001,696, filed on Dec. 31, 1997, now Pat. No. 6,031,241, which is a continuation-in-part of application No. 08/815,283, filed on Mar. 11, 1997, now Pat. No. 5,963,616.

(60) Provisional application No. 60/117,177, filed on Jan. 25, 1999.

(51) Int. Cl.$^7$ ............................................. G21G 4/00
(52) U.S. Cl. ................ 250/504 R; 250/504; 250/493.1
(58) Field of Search ........................... 250/504, 504 R, 250/493.1

(56) References Cited

U.S. PATENT DOCUMENTS

| | | | | |
|---|---|---|---|---|
| 4,199,703 A | * | 4/1980 | Samson | 313/231.71 |
| 4,229,708 A | | 10/1980 | Mani et al. | 331/94.5 G |
| 4,441,189 A | | 4/1984 | Macklin | 372/76 |
| 4,538,291 A | | 8/1985 | Iwamatsu | 378/119 |
| 4,574,198 A | | 3/1986 | Lucas et al. | 250/493.1 |
| 4,592,056 A | | 5/1986 | Elton | 372/5 |
| 4,759,894 A | * | 7/1988 | McCorkle | 376/100 |
| 4,860,328 A | | 8/1989 | Frankel et al. | 378/34 |
| 4,872,189 A | | 10/1989 | Frankel et al. | 378/119 |
| 4,937,832 A | | 6/1990 | Rocca | 372/76 |
| 5,117,432 A | | 5/1992 | Nilsen | 372/5 |
| 5,177,774 A | | 1/1993 | Suckewer et al. | 378/43 |
| 5,243,638 A | | 9/1993 | Wang et al. | 378/119 |
| 5,275,663 A | | 1/1994 | Kim et al. | |
| 5,327,475 A | | 7/1994 | Golovanivsky et al. | 378/34 |
| 5,382,804 A | | 1/1995 | D'Silva | |
| 5,499,282 A | | 3/1996 | Silfvast | 398/119 |
| 5,563,923 A | | 10/1996 | Okada et al. | 378/138 |
| 5,577,092 A | | 11/1996 | Kublak et al. | 378/119 |
| 5,585,641 A | | 12/1996 | Sze et al. | 250/492.1 |
| 5,606,588 A | | 2/1997 | Umstadter et al. | 378/119 |
| 5,763,930 A | | 6/1998 | Partlo | |
| 5,963,616 A | | 10/1999 | Silfvast et al. | 378/122 |

* cited by examiner

Primary Examiner—John R. Lee
Assistant Examiner—Anthony G. Quash
(74) Attorney, Agent, or Firm—Brian S. Steinberger; Law Offices of Brian S. Steinberger, P.A.

(57) ABSTRACT

An emitting capillary discharge light source is modified by means to provide for constant, capillary discharge chamber diameter despite interior surface erosion during operation of the light source in order to maintain capillary bore size. The emissions are generated within the capillary discharge chamber and discharged from its outlet. The emission also carries debris generated from within the capillary discharge chamber by erosion of its inner walls reducing its initial inner diameter. The debris is deleterious to the mirrors and other components positioned in the emission stream whereas the erosion distorts the plasma beam. This increase in the initial inner diameter of the discharge chamber leads rapidly to poor imaging of the light stream. By keeping the inner bore diameter of the capillary discharge chamber constant, i.e., 110%, and preferably 105%, of the initial inner bore diameter, the imaging problem is overcome.

12 Claims, 7 Drawing Sheets

ADJUSTABLE BORE CAPILLARY DISCHARGE

This invention relates to emitting capillary discharge light sources, and in particular to a constant bore diameter emitting capillary discharge light source useful in applications in extreme ultraviolet (EUV) lithography, microscopy, materials processing, metrology, resist analysis, as well as applications in other spectral regions such as the visible, ultraviolet, and vacuum ultraviolet for laser pumping and the like, where a small and very intense light source is required and this invention is a Continuation-In-Part of U.S. Ser. No. 09/001,696 filed on Dec. 31, 1997 now U.S. Pat. No. 6,031,241, which is a Continuation-in-Part of U.S. Ser. No. 08/815,283 filed on Mar. 11, 1997 now U.S. Pat. No. 5,963,616 both by the same assignee thereof, both of which are incorporated by reference and further claims the benefit of priority based on U.S. Provisional Application No. 60/117,177 filed Jan. 25, 1999.

BACKGROUND AND PRIOR ART

A commercially suitable Soft-X-Ray or EUV lithography facility will require an intense soft x-ray/EUV light source that can radiate within a specific wavelength region within the range of approximately 11 to 14 nm in the EUV part of the electromagnetic spectrum. Capillary discharge sources have been proposed that can be used in such a facility. One such embodiment of the proposed capillary discharge source was first described in U.S. Pat. No. 5,499,282 by William T. Silfvast issued on Mar. 12, 1996 and is incorporated herein by reference. That particular proposed source would operate in a lithium vapor electrically excited to within specific ranges of plasma electron temperatures (10–20 eV) and electron densities ($10^{16}$ to $10^{21}$ $cm^{-3}$) which are required for optimally operating a lithium vapor discharge lamp at 13.5 nm. That same patent also proposed soft-x-ray lamps at wavelengths of 7.6, 4.86, and 3.38 nm in beryllium, boron, and carbon plasmas. These wavelengths, however, are not within the range of wavelengths required for EUV lithography. Although that patent described the general features of these lamps, it did not give the specific discharge current operating range that would minimize bore erosion and the emission of debris from the lithium lamp, or the appropriate range of bore sizes for operating such a lamp.

Another proposed discharge source for use with EUV lithography was the "differentially pumped capillary" discharge source that was described in U.S. Ser. No. 09/001, 696 filed on Dec. 31, 1997 entitled: Capillary Discharge Extreme Ultraviolet Lamp Source for EUV Microlithography and other Related Applications, by the same assignee, which is incorporated by reference.

Some problems have been observed with these discharge sources described above. During operation of the discharge the interior walls of the capillary erode causing debris to be emitted from the discharge source. Firstly, the debris can be destructive to the surrounding optics such as concave mirrors immediately adjacent to the capillary bore opening. The emitted debris can both form a layer on the mirror lowering its reflectivity and cause destructive pits on the concave surface of the mirror destroying its utility. Secondly, the resultant erosion also increases the diameter of the capillary bore size whereby the light imaging usefulness of the device is degraded.

SUMMARY OF THE LNWENTION

The first object of the present invention is to provide a capillary discharge chamber having a useful bore diameter during the operation of a capillary discharge light source.

The second object of the present invention is to provide a capillary discharge chamber having a capillary bore that is adjusted for erosion to provide a constant bore diameter during operation of a capillary discharge lamp.

The third object of the present invention is to provide a capillary discharge chamber having a capillary bore that is adjusted radially to maintain a constant bore diameter during operation of a capillary discharge light source.

The fourth object of the present invention is to provide an emitting capillary discharge light source having an improved capillary discharge chamber for applications in EUV lithography, microscopy, materials processing, metrology and resist analysis.

A preferred embodiment of the invention is to provide an emitting capillary discharge source having a capillary discharge tube configuration in which the bore of said tube is constructed to maintain a constant bore diameter during operation of the source.

A second preferred embodiment is related to an emitting capillary discharge source, comprising an electrode means; an insulated capillary having an initial inner bore diameter, the capillary being adjacent to the electrode means; a gas for being inserted within the capillary; voltage means for causing a light emission from the capillary; and, means for maintaining the initial diameter of the initial bore diameter at a constant value over time, for additional light emissions.

A third preferred embodiment has said means for maintaining the initial diameter of the initial bore diameter at a constant value over time wherein the constant value is at least 110%, and optimally 105% of the initial inner bore diameter, for lithographic applications.

Further objects and advantages of this invention will be apparent from the following detailed descriptions of presently preferred embodiments which are illustrated in the accompanying drawings.

DESCRIPTION OF THE PREFERRED EMBODIMENTS

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Figure 1A:
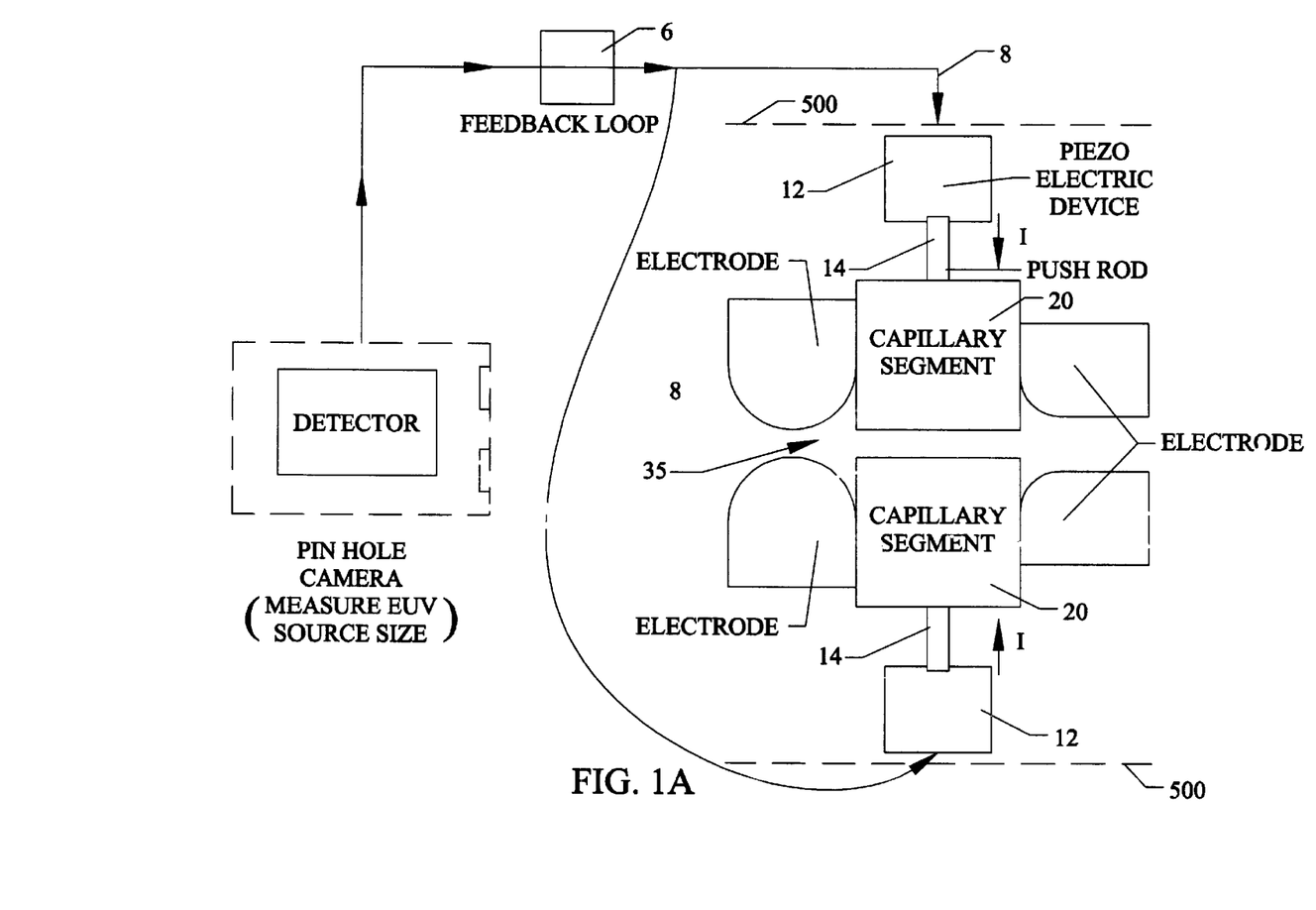
FIG. 1a is a schematic layout of the preferred embodiment of the invention.

As earlier noted FIG. 1a is a schematic layout of the preferred embodiment of the invention which for simplicity concentrates on the means for maintaining the initial diameter of the capillary chamber diameter at a constant value whereby the useful operational lifetime of a capillary discharge light source is extended. A constant value of the capillary 20 discharge chamber inner diameter for purposes of this disclosure is up to and including 110%, preferably 105%, of the initial inner diameter. Useful capillary 20 discharge chamber inner diameters for an emitting capillary discharge source range between approximately 0.5 mm and approximately 2.51 mm with the capillary 20 having an overall length between approximately 1 mm and approximately 10 mm. Should the erosion of the walls occur non-uniformly, the constant value would be determined by the mean diameter of the capillary 20 discharge chamber emitting end 35.

The capillary ceramic body contains the chamber within which a gas discharge plasma is initiated. It also serves as the insulator between the electrodes. The key to monitoring the adverse increase of capillary diameter is the use of a detector 2 as noted in FIG. 1a which lies outside the envelope of the capillary discharge light source. The detector 2 is directed towards the plasma discharge 35 to measure its EUV emission diameter which increases as the initial diameter of the inner bore of the capillary chamber increases as a result of the inner wall surface, erosion of the capillary chamber resulting from light emission. The detector 2 can be a simple pinhole camera capable of receiving an optical (EUV) picture of plasma size and so placed to provide a standard plasma diameter(for example, 1.5 mm) by means of which a constant inner bore capillary chamber can be realized. Useful detectors 2 can alternatively include a microchannel plate array detector available from Acton Research and an Extreme-UV Intensity Profiler BIP-12F from the Coherent Auburn Group. The detector 2 would normally be placed to occupy a very small space so as to not obstruct the useful EUV light. The electrical signal output from the detector 2 flows via a feedback loop to a computer 6 such as an IBM compatible Pentium II and the resultant output information signal 8 passed onto the means for maintaining a constant inner diameter of the capillary chamber. In FIG. 1a, the means is shown as cooperative piezoelectric body 12, such as barium titanate, connected to a push rod 14. The piezoelectric body 12 is electrically stressed and moves against a push rod 14 which moves the insulator ceramic capillary 20 segment inward to maintain the chamber's diameter constant. An alternative to the piezoelectric-rod combination (12 and 14 ) is a Motor-Driver™ Linear Actuator 37-0021 sold by the Coherent Auburn Group where the Actuator would be directly responsive to the information signal 8 from the computer or alternatively directly from the detector 2 since the Actuator has a resolution of 0.1 µm. In each case, the push rod 12 or Actuator driver tip is secured its respective capillary 20 segment. An outer exterior chamber 500 formed from a nonconductive material such as a high temperature ceramic such as silicon carbide, and the like, can house the components including actuator 12, and the like. The outer exterior chamber shape 500 can be an elongated cylinder, hexagon, and the like.

Figure 1B:
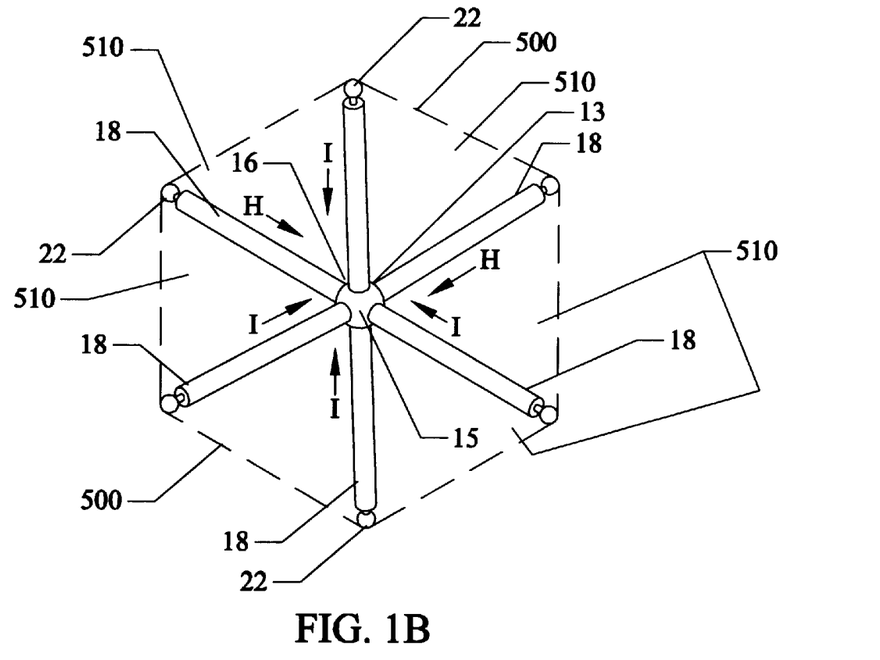
FIG. 1b shows the end view of a constant quasi-circularly shaped capillary chamber used in the invention.

Since FIG. 1a contains a cross-sectional view of the capillary discharge device including the capillary segment, reference should now be made to the capillary discharge chamber configuration as shown in FIG. 1b in which the capillary discharge chamber diameter 13 is continually or on a periodic basis adjusted to maintain a reasonable and useful, i.e., constant as defined earlier, diameter 15 even though erosion continues to wear away the walls 16 of the capillary 20 segments 18 during emission. The invention involves using elongated pieces 18 of capillary 20 as the segments 18 material, the ends of which are flat and angularly arranged to form a quasi-circularly shaped capillary chamber 13 as shown schematically in FIG. 1b. If six capillary pieces 18 are used for example, then the actual inner chamber diameter shape 15 would be hexagonal rather than circular. As the chamber walls erodes during operation, the push tips 22 of an Actuator (shown only as one however six would be used for each segment) would move the capillary pieces radially towards the center of the capillary segment axis axis to maintain the constant bore diameter. The movement could be continually functioning or applied at intervals either predetermined or as needed to maintain the capillary discharge diameter 15 substantially constant. As previously mentioned, erosion within the interior walls of the chamber 15 distorts the emitted plasma beam. This increase in the initial inner diameter of the discharge chamber leads rapidly to poor imaging of the light stream. By keeping the inner bore diameter of the capillary discharge chamber substantially constant, within 110%, and preferably 105%, of the initial inner bore diameter, the imaging problem is overcome.

Figure 1C:
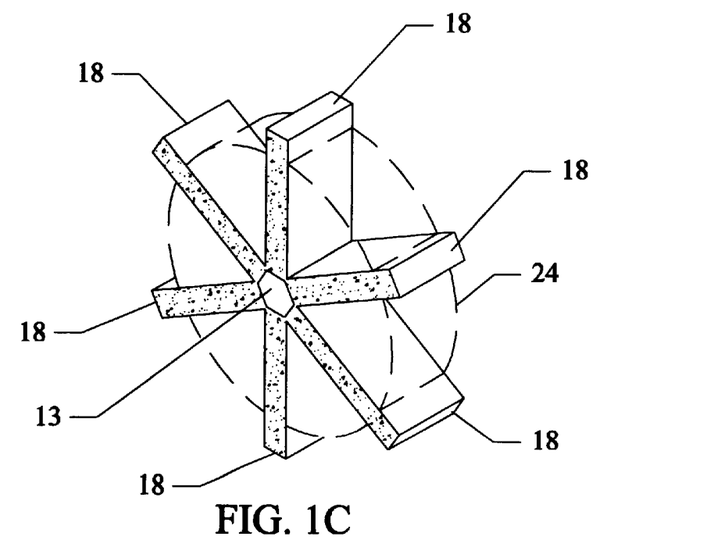
FIG. 1c shows a three-dimensional schematic view of one configuration of a constant capillary chamber useful in the invention.

The capillary segments 18 can be held in place and guided by fixed wedge shapes 510 that are between each of the segments 18. Wedge shape guides 510 can be formed from insulating materials such as a nonconductive material such as a high temperature ceramic such as silicon carbide, and the like, that would allow the individual pieces 18 to slide radially inward in the direction of arrow I towards the center axis of the capillary discharge chamber 15. The guides 510 can be sized to form a substantial seal against the moveable pieces 18. The dimensions of the end of each piece would be determined by the desired chamber diameter in one dimension and by either the length of the capillary or the length of the capillary segment in the other dimension. The third dimension of the segments, the elongated dimension, would be determined by the operating life desired and by the constraints necessary to keep the capillary discharge chamber positioned correctly and to conduct the heat away from the discharge region. It most likely would be made of an insulating material such as a machineable ceramic. FIG. 1c shows a three-dimensional schematic view of one configuration of the capillary discharge chamber. It consists of six capillary segments 18 arranged axially with a support structure 24. The capillary material as well as the supporting structure would be selected for other properties such as minimal bore erosion, high thermal conductivity, good electrical resistivity, and the like.

Figure 2:
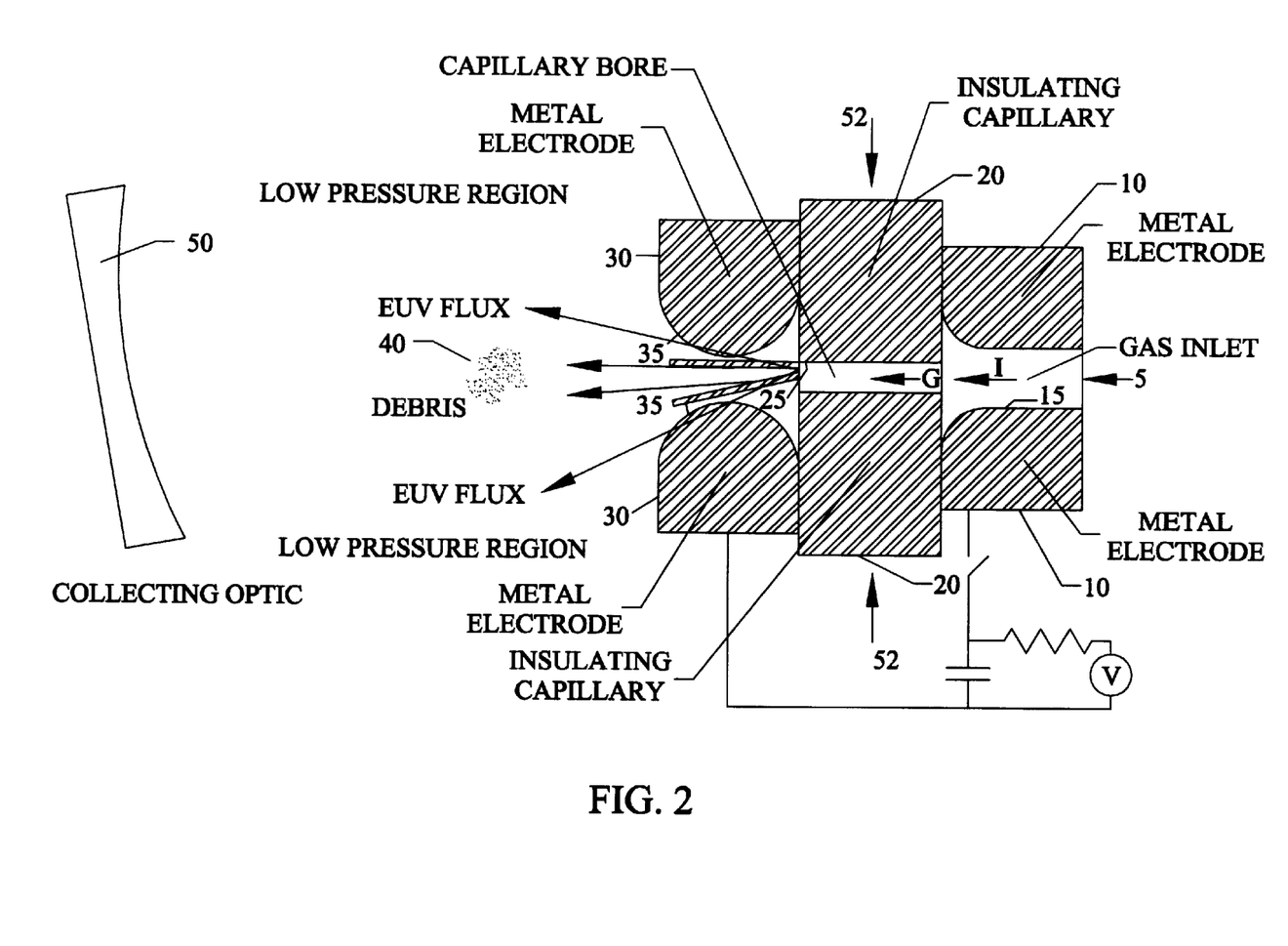
FIG. 2 is a side cross-sectional view of an end-emitting differentially pumped capillary (DPC) discharge source having an adjustment mechanism for maintaining the initial inner bore capillary diameter at a constant value.
Figure 3:
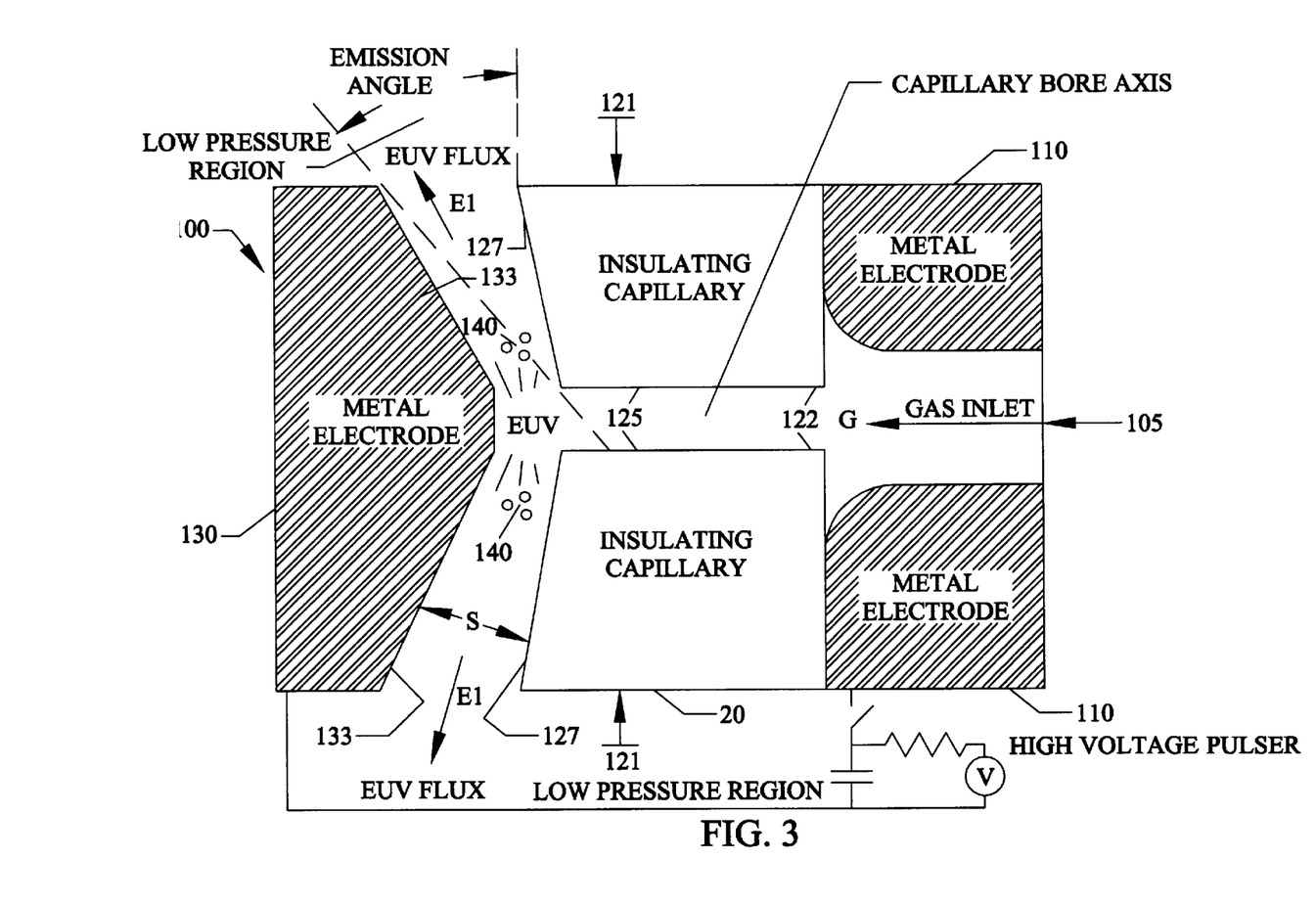
FIG. 3 is a side cross-sectional view of an angular pumped and emitting capillary (APEC) discharge source having a spring tension means for maintaining the initial inner bore capillary diameter at a constant value.
Figure 4:
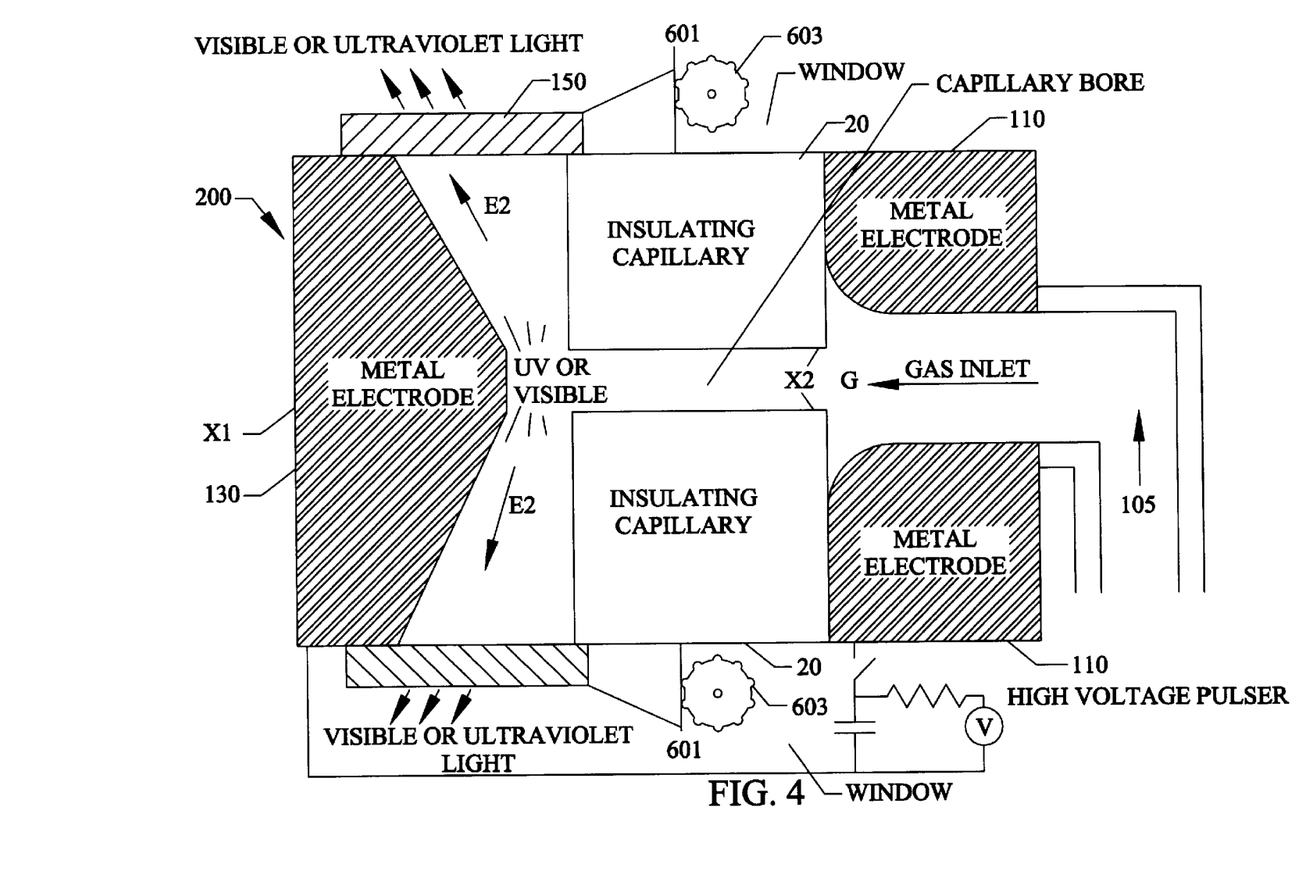
FIG. 4 is a side cross-sectional view of a second embodiment of an angular pumped and emitting capillary (APEC) discharge source having a mechanical means for maintaining the initial inner bore capillary diameter at a constant value wherein said means is activated by measurement of said bore during emission.

The electronic, mechanical or manually inwardly adjustments to the capillary segments to maintain constant the capillary discharge diameter can be made by numerous techniques including: (1) a constant inwardly directed spring tension device as illustrated in FIG. 3; (2) a mechanical device that moves the segments radially inward (stepwise) in a series of predetermined amounts as illustrated by FIG. 4;

(3) moving the segments by manipulation of the several requisite push rods using the earlier referenced Linear Actuator System; or, by ( as shown in the preferred embodiment illustrated in FIG. 1) using remote measurement of the emitted plasma. Heat conducting attachments to the capillary segments at locations away from the discharge region may be necessary to conduct the heat away during high repetition rate operation FIG. 2 is a side cross-sectional view of an end-emitting differentially pumped capillary (DPC) discharge source. The DPC has metal electrode 10 having a port through-hole 15 for allowing gas G such as xenon 2 to enter through port 15 in the direction of arrow I from a high pressure region 5. On the opposite side of an electrically insulating or partially insulating capillary 20 of the invention is a second electrode 30. Electrodes 10 and 30 serve as electrical connections to the flowing gas G, that is located between those electrodes 10 and 30 within the bore of the capillary 20 discharge chamber of the invention (hereinafter designated as capillary 20). When a voltage V, is applied between the electrodes 10, 30, an electric field is produced within the gas G between the electrodes 10, 30, and particularly within the capillary 20 discharge chamber, that causes electrons to be accelerated and collide with the gaseous atoms into highly excited and ionized states that radiate the desired light for use in various applications that are described above. An example of the differentially pumped capillary (DPC) discharge source of FIG. 2 along with operational ranges of current, pressure, repetition rate, and the like, is described and shown in U.S. Ser. No. 09/001,696 Filed on Dec. 31, 1997 entitled: Capillary Discharge Extreme Ultraviolet Lamp Source for EUV Microlithography and other Related Applications, by, the same assignee, which is incorporated by reference.

Referring to FIG. 2, gas G is flowed into the electrode region 10 at a selected pressure between approximately 0.1 and approximately 50 Torr and is pumped out at the radiation emitting end as described above such that the pressure beyond the emitting end 35 of the capillary 20 is less than approximately 0.1 to approximately 0.01 Torr (depending upon the absorption path length to the collecting optic) to avoid absorption of the EUW light emitted from the capillary. Debris 40 is produced when the current pulse is initiated within the capillary 20 discharge chamber and is ejected from the emitting end 35 of the capillary 20 and can be propelled toward optic components 50 (such as a multi-layer concave reflecting mirror with alternating layers of molybdenum and silicon) that are used to collect the radiation E emitted from the end 35 of the capillary 20, thereby damaging the optics 50 either by pitting it with particle chunks of debris or by coating it with a layer of absorbing material. As the erosion occurs to the inner wall of the capillary 20 bore, a radial force 52 is imposed onto the capillary 20 exterior surface to maintain its initial inner bore diameter at a constant value thus enabling an extension of the useful emission time by preventing defocusing of the capillary discharge source.

All debris exiting from the lamp region is potentially damaging to EUV collecting optics 10 facing the output of the capillary discharge. Submicron-sized particles down to single atoms produce a coating on the surface of the optics which leads to partial absorption of the EUV light. Larger particles, especially those greater than approximately 10 microns in diameter, can crater and dig into the surface of the optics, thereby reducing the useful EUV flux. Further as earlier noticed, the debris from capillary 20 discharge chamber increases the bore diameter by abrasion from the interior wall; however, the means of the invention which maintains the capillary 20 discharge inner bore diameter constant with its initial value during continual light emissions will markedly extends the lamp's useful focal time, particularly, for imaging uses as in lithography.

FIG. 3 is a side cross-sectional view 100 of an embodiment of an angular pumped and emitting capillary (APEC) discharge source employing a spring means 121 maintained under adjustable inward pressures to maintain a constant inner bore diameter of the capillary 20 according to the subject invention. The uniqueness of the APEC is the geometry of the capillary 20 and electrode 130 at the light emitting end 127 of capillary 20. In FIG. 2, the radiation E is emitted in an angular direction E1 (because the pressure is typically higher than the ordinary DPC 1 of FIG. 2), symmetrically around the capillary 20 at the low pressure end 127. The capillary end region 127 is tapered as is the end 133 of the electrode 130 with an adjustable space S (approximately 0.1 mm to approximately 5 mm for DPC 1 and approximately 0.1 mm and up if only the collecting trap is used) between them. The radiation E1 that is collected at optics 150 (shown in FIG. 4) comes primarily from the mouth 127, 133 of the cathode as well as from the area between electrodes 110, 130. This angular tapered region 127 allows the light E1 to be collected in a large solid angle which in FIG. 3 can range from approximately 15 degrees or greater with respect to the axis of capillary 20. This geometry also allows differential pumping to continue through the tapered region so that the pressure in the emitting region 127 at the end of the capillary bore 125 is still at sufficiently high pressure to generate high radiation flux and also to provide sufficient gas to allow conduction of the discharge current to the electrode 130.

Referring to FIG. 3, the electrode 130 also provides a direct blocking path for any debris that might be generated within the bore region 125 as the discharge current passes through the capillary 20. Different angles can be used within the angular region as well as different gaps between the capillary bore mouth 127 and the electrode 130 to allow for optimization of the radiation flux output. The flux output can be measured with a calibrated EUV diode type meter, so that the separation space is adjusted between the end of the capillary and the blocking means, until a maximum radiation is achieved.

At the high pressure end 122 of the capillary bore 125 where the gas G is flowed into the capillary 20, the electrode 110 can be of several configurations including the hollow cylinder shape as shown in FIG. 3 or a solid cylinder shape that is inserted within the capillary discharge region where the gas is flowed around the cylinder or flowed through a hole in the cylinder electrode. Another version might be a heated treated filament as a cathode.

FIG. 4 is a side cross-sectional view 200 of a second embodiment of an angular pumped LD and emitting capillary (APEC) discharge source of the subject invention incorporating a window 150 around the emitting region and having a constant pressure of the gas within that region, rather than operate with differential pumping. The APEC device of FIG. 4 is for obtaining intense visible, ultraviolet, or vacuum ultraviolet emission. This version incorporates a window 150 around the emitting region E2 and has a constant pressure of the gas within that region, rather than operate with differential pumping. Here the insulating capillary 20 could be the device of FIGS. 1a–1c, with the end face of the capillary 20 normal to the discharge axis. Each of the arms 18 would be movably supported by additional insulating material 24 with a notched plunger 601 cooperating with machine 603 to maintain constant the diameter of the bore of the capillary 20. The large electrode 130 serves to block and collect debris and there would be a much larger angular admitting region because differential pumping would not be required to avoid absorption of the emission E2 by the emitting gas outside of the bore region.

Figure 5A:
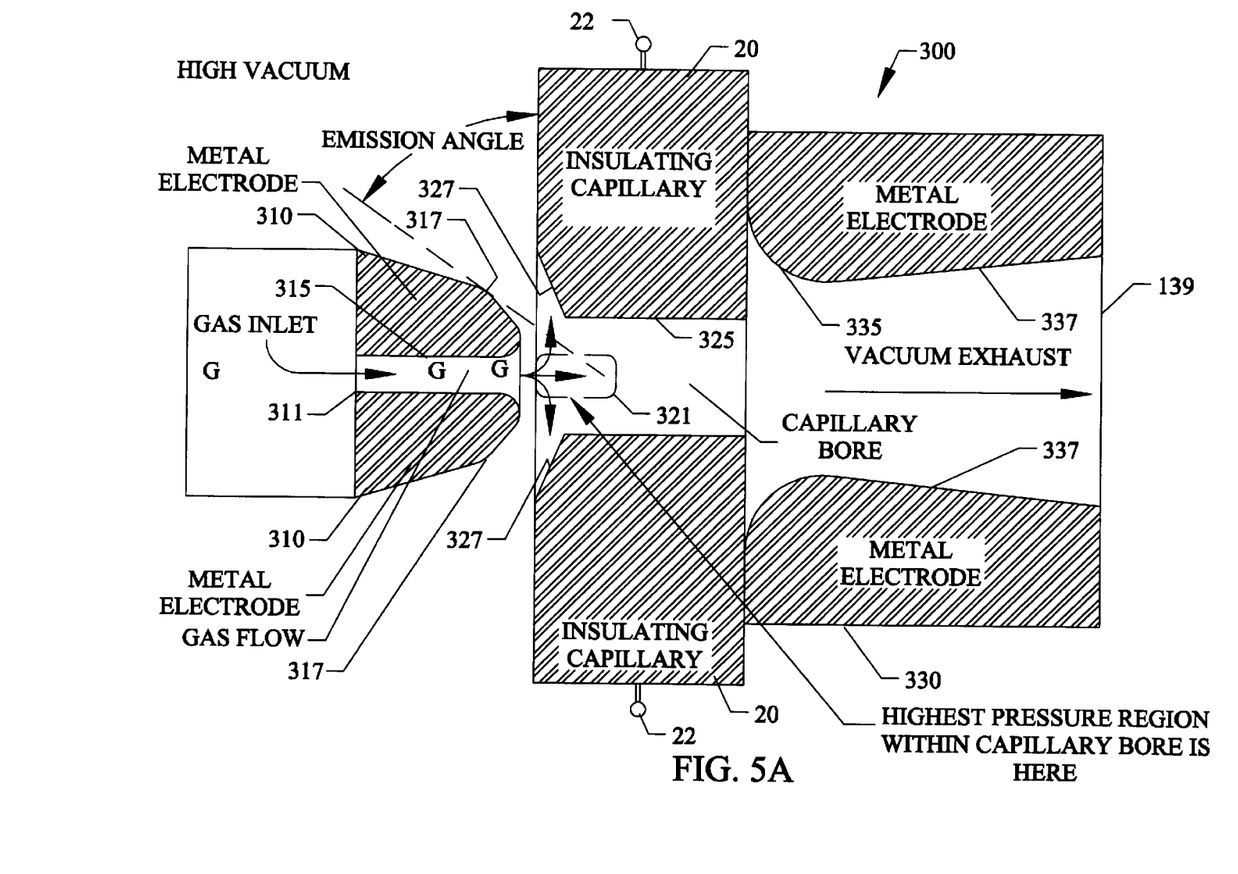
FIG. 5a is a side cross-sectional view of an additional embodiment of an angular pumped and emitting capillary (APEC) discharge source having a radial tension means for maintaining the initial inner bore capillary diameter at a constant value.

FIG. 5a is a side cross-sectional view 300 of a further embodiment of an angular pumped and emitting capillary (APEC) discharge source. This embodiment is a variation on the APEC design shown in FIG. 3. Here the principal functional difference is that the gas is admitted to the system from the same end at which the useful light is emitted. Discharge conditions and parameters are identical to the APEC 100. Referring to FIG. 5a, the angular pumped and emitting capillary 20 of embodiment 300, has metal electrodes 310 and 330 at opposite ends of an insulating capillary 20 whose bore 325 is filled with gas (i.e., Xenon) under electrical discharge conditions and has external mechanical means 22 to retain constant the inner diameter of said capillary 20. Both the metal electrodes 310 and 330 are hollow with axial bores 315 and 335–337, respectively. Gas G is flowed into the discharge region through the axial bore hole 315 in the metal electrode 310 located at the end of the capillary from which the useful radiation is emitted. Gas is admitted to this electrode by a gas inlet 311 connected to plumbing (not shown in FIG. 5a) in a similar fashion to the APEC 100. Outflowing gas enters both the capillary 20 bore 325 and the annular gap between the electrode face 317 and the capillary face 327, which bound the line-of-site of the emitted useful radiation. This results in a region 321 of high gas density in the region of the discharge seen directly along the line-of-sight, which increases radiated output relative to the simpler APEC 100. Gas is pumped away both in the low pressure region into which the radiation is emitted, and also through the vacuum exhaust bore hole 339 in the metal electrode 330 on the opposite side of the capillary.

Additionally, the holes 315, 339 in both electrodes 310, 330 serve as "shock tubes", which guide the discharge-induced gas pressure pulse by allowing an unimpeded path for ax/al gas to flow. Much of the particulate debris shot out the radiating end 317, 327 of the capillary 20 would simply travel down the gas inlet line and come to rest deep in the gas reservoir behind the electrode 310. Finally, the flowing gas may serve to cool and protect the components. A tube of flowing gas exhausting into vacuum forms a Mach 1 nozzle. The kinetic temperature in a Mach 1 expansion is for a monatomic ideal gas, three-fourths of the reservoir temperature. If the inlet gas is cooled nearly to its freezing point temperature (to less than 4/3 its freezing temperature in Kelvins) then the expansion should cause gas to freeze out on the tip of the electrode and inner wall of the capillary bore, to serve as an ablative buffer which may reduce bore erosion and debris formation in the first place. Gas that does not freeze out would flow more slowly and have a higher atom density for a given inlet pressure, which also would be salutory from the standpoint of maximizing the radiator density at the radiating end of the capillary. Finally, it cools the capillary material making it a better insulator.

Figure 5B:
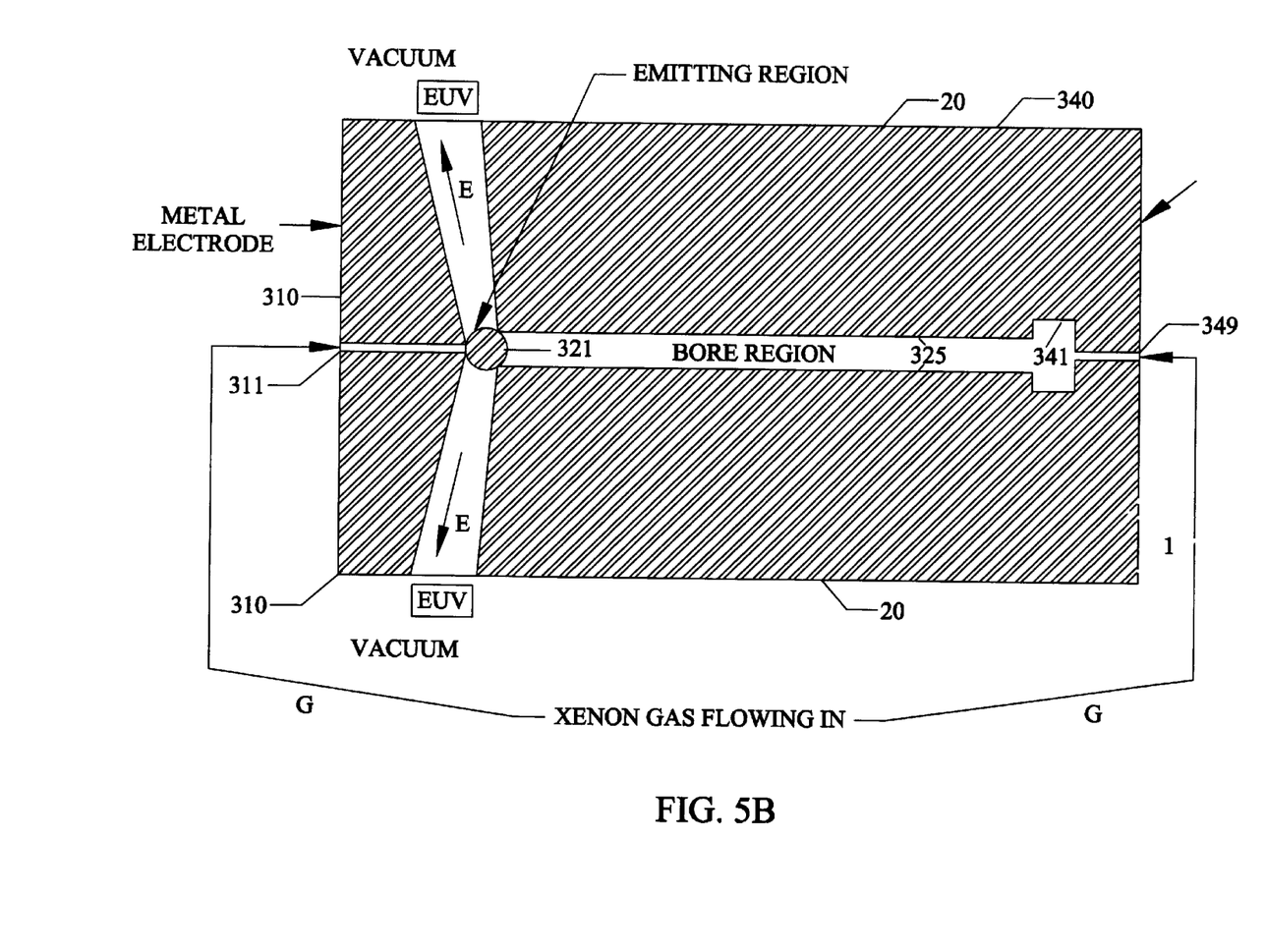
FIG. 5b is another view of FIG. 5a showing arrows for gas flow, and EUV emission.

Another variation on the modified APEC design is shown in FIG. 5b. Here, the radiating gas G flowed into the capillary 20 through both metal electrodes 310 and 340. Electrode 340 has a C-cross-sectional shape with interior 341 and gas inlet 349. Gas exhaust and useful radiation E are removed by the vacuum; region containing the optics as for the simpler APEC I00. This configuration maintains a more nearly uniform high density of gas throughout the length of the capillary than any other design.

The emitting capillary discharge lamp operating at wavelengths longer than approximately 100 μm can be used for materials processing, medical treatment such as photodynamic therapy, and other applications where pulsed high flux vacuum ultraviolet, ultraviolet, visible and near infrared wavelengths of emitted light are required.

This source can have applications for an EUV microscope. Such a microscope could be used to observe features as small as 0.05 microns (50 μm) and have very large depth of focus. One application would be as an inspection tool on a microlithography fabrication line in which great depth of focus is required to observe the resist or chip feature side-walls for uniformity and wall slope. It might also be used in hospitals, for example in pathology labs, where a tissue sample (biopsy) needs to be inspected immediately after it is taken from a patient. The microscope can also be used for general high resolution analysis in chemical and pharmaceutical labs.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. An emitting capillary discharge source, comprising:
    an electrode;
    an insulated capillary discharge chamber having an initial inner bore diameter, the capillary discharge chamber being adjacent to the electrode;
    a gas for being inserted within the capillary discharge chamber;
    voltage means for causing a light emission from the capillary discharge chamber; and,
    means for maintaining the initial inner bore diameter of the capillary discharge chamber inner diameter at a constant value over time, for additional light emissions, the constant value being at least approximately 110% of the initial inner bore diameter for lithographic applications.

2. The emitting capillary discharge source of claim 1, wherein the constant value is at least approximately 105% of the initial inner bore diameter, for the lithographic applications.

3. The emitting capillary discharge source of claim 1, wherein said means for maintaining the initial bore diameter at a constant value is a spring.

4. The emitting capillary discharge source of claim 1, wherein said means for maintaining the initial bore diameter at a constant value is selected from one of: a mechanically actuated plunger, and an electrically actuated plunger.

5. The emitting capillary discharge source of claim 1, wherein said means for maintaining the initial bore diameter at a constant value includes a remote detector of said light emissions.

6. The emitting capillary discharge source of claim 1, wherein the means for maintaining at a constant value provides inwardly directed radial force toward the bore.

7. The emitting capillary discharge source of claim 1, wherein the capillary discharge chamber has an inner core diameter between approximately 0.5 mm and approximately 2.5 mm and an overall length which ranges between approximately 1 mm and approximately 10 mm.

8. The emitting capillary discharge source of claim 1, wherein said means for maintaining the initial bore diameter at a constant value is a quasi-circularly shaped capillary using elongated segments of capillary material, the ends of which are flat and angularly arranged to form the inner wall of said discharge chamber.

9. The emitting capillary discharges of claim 8, wherein there are six of said elongated pieces.

10. An emitting capillary discharge source, comprising:

an electrode;

an insulated capillary discharge chamber having an initial inner bore diameter, the capillary discharge chamber being adjacent to the electrode;

a gas for being inserted within the capillary discharge chamber;

voltage means for causing a light emission from the capillary discharge chamber; and, means for maintaining the initial inner bore diameter of the capillary discharge chamber inner diameter at a constant value over time, for additional light emissions, said means for maintaining the initial bore diameter at a constant value being a spring.

11. An emitting capillary discharge source, comprising:

an electrode;

an insulated capillary discharge chamber having an initial inner bore diameter, the capillary discharge chamber being adjacent to the electrode;

a gas for being inserted within the capillary discharge chamber;

voltage means for causing a light emission from the capillary discharge chamber; and, means for maintaining the initial inner bore diameter of the capillary discharge chamber inner diameter at a constant value over time, for additional light emissions, said means for maintaining said initial bore diameter at a constant value being selected from one of: a mechanically actuated plunger, and an electrically actuated plunger.

12. An emitting capillary discharge source, comprising:

an electrode;

an insulated capillary discharge chamber having an initial inner bore diameter, the capillary discharge chamber being adjacent to the electrode;

a gas for being inserted within the capillary discharge chamber;

voltage means for causing a light emission from the capillary discharge chamber; and, means for maintaining the initial inner bore diameter of the capillary discharge chamber inner diameter at a constant value over time, for additional light emissions, said means for maintaining the initial bore diameter at a constant value is a quasi-circularly shaped capillary using elongated segments of capillary material, the ends of which are flat and angularly arranged to form the inner wall of said discharge chamber.

* * * * *